United States Patent
Spotti et al.

(10) Patent No.: US 9,337,370 B2
(45) Date of Patent: May 10, 2016

(54) APPARATUS AND METHOD FOR THE AUTOMATIC ASSEMBLY OF PHOTOVOLTAIC PANELS

(71) Applicant: VISMUNDA S.R.L., Venezia, Frazione Mestre (IT)

(72) Inventors: Davide Spotti, Trieste (IT); Elisa Baccini, Carbonera (IT)

(73) Assignee: VISMUNDA S.R.L., Venezia Fraz, Mestre (IT)

( * ) Notice: Subject to any disclaimer, the term of this patent is extended or adjusted under 35 U.S.C. 154(b) by 0 days.

(21) Appl. No.: 14/440,439

(22) PCT Filed: Nov. 4, 2013

(86) PCT No.: PCT/EP2013/072935
§ 371 (c)(1),
(2) Date: May 4, 2015

(87) PCT Pub. No.: WO2014/072253
PCT Pub. Date: May 15, 2014

(65) Prior Publication Data
US 2015/0287857 A1 Oct. 8, 2015

(30) Foreign Application Priority Data
Nov. 9, 2012 (IT) .............................. TV2012A0211

(51) Int. Cl.
*H01L 31/05* (2014.01)
*H01L 31/048* (2014.01)
(Continued)

(52) U.S. Cl.
CPC ........ *H01L 31/048* (2013.01); *H01L 21/67178* (2013.01); *H01L 21/67253* (2013.01);
(Continued)

(58) Field of Classification Search
None
See application file for complete search history.

(56) References Cited

U.S. PATENT DOCUMENTS 4,331,492 A * 5/1982 Dominguez .......... H01L 31/048
136/251
8,225,496 B2 * 7/2012 Bachrach ................ B26F 3/002
29/33 P
(Continued)

FOREIGN PATENT DOCUMENTS

WO WO 2011/071373 A1 6/2011
WO WO 2012/058053 A2 5/2012

OTHER PUBLICATIONS

De Jong, P.C., "Single-Step Laminated Full-Size PV Modules Made with Back-Contacted MC-SI Cells and Conductive Adhesives", 19th European Photovoltaic Solar Energy Conference Internet Citation, vol. II, Jun. 7, 2004, Jun. 11, 2004, pp. 2145-2148, retrieved from the Internet: URL: ftp://ftp.ecn.nl/pub/www/library/report/2004/rx04067.pdf (retrieved on Jun. 5, 2012).
(Continued)

*Primary Examiner* — Alexander Ghyka
(74) *Attorney, Agent, or Firm* — Scully, Scott, Murphy & Presser, P.C.

(57) ABSTRACT

Apparatus and method for the automatic assembly of photovoltaic panels with back-contact architecture, the apparatus comprising a series of six stations that are configured in sequence in a carousel with recirculation of trays and a control device, which is adjacent to one or more of the stations, for controlling the correctness of the processes performed, the control device enabling the processing or the mere transit of the tray into the subsequent station by comparing the actual state with a predefined state. If one or more of the controls performed in the transfers between the six stations yields a negative outcome regarding the correctness of the operation performed previously, the control device enables the mere transit of the tray with its content to the subsequent stations until it reaches the first station without undergoing any tipping.

10 Claims, 4 Drawing Sheets

(51) Int. Cl.
*H01L 31/18* (2006.01)
*H01L 21/67* (2006.01)
*H01L 21/677* (2006.01)

(52) U.S. Cl.
CPC ...... *H01L21/67736* (2013.01); *H01L 31/0516* (2013.01); *H01L 31/188* (2013.01); *H01L 31/1876* (2013.01); *Y02E 10/50* (2013.01); *Y02P 70/521* (2015.11); *Y10T 29/53048* (2015.01); *Y10T 29/53187* (2015.01)

(56) References Cited

U.S. PATENT DOCUMENTS

| | | | | |
|---|---|---|---|---|
| 2011/0033957 | A1* | 2/2011 | Holden | G01B 11/0683 438/16 |
| 2011/0285840 | A1* | 11/2011 | Benson | G01N 21/95684 348/87 |
| 2012/0186629 | A1* | 7/2012 | Nowlan | H01L 31/048 136/251 |
| 2012/0285525 | A1* | 11/2012 | Okamoto | H01L 21/02381 136/255 |
| 2014/0000682 | A1* | 1/2014 | Zhao | H01L 31/0481 136/251 |
| 2014/0202536 | A1* | 7/2014 | Ikenaga | C08K 5/14 136/259 |
| 2014/0318611 | A1* | 10/2014 | Moslehi | H01L 31/022441 136/256 |
| 2015/0287875 | A1* | 10/2015 | Phu | H01L 31/0508 29/745 |

OTHER PUBLICATIONS

Gee, James M., "Development of Commercial-Scale Photovoltaic Modules Using Monolithic Module Assembly", Photovoltaic Specialists Conference (PVSC), 2009 34th IEEE, IEEE, Piscataway, NJ, USA, Jun. 7, 2009-Jun. 12, 2009, pp. 2133-2137.

Spath, M., "A Novel Module Assembly Line Using Back Contact Solar Cells", Conference Record of the IEEE Photovoltaic Specialists Conference, San Diego, USA, 33rd, May 11, 2008-May 15, 2008, pp. 1-6.

Tjengdrawira, C., "World First 17% Efficient Multi-Crystalline Silicon Module", 2010 35th IEEE Photovoltaic Specialists Conference, Jun. 1, 2010, pp. 002802-002805.

International Search Report dated Dec. 4, 2013 issued in PCT/EP2013/072935.

International Preliminary Report on Patentability dated Dec. 4, 2014 issued in PCT/EP2013/072935.

* cited by examiner

APPARATUS AND METHOD FOR THE AUTOMATIC ASSEMBLY OF PHOTOVOLTAIC PANELS

FIELD OF THE INVENTION

The present invention relates to an apparatus and a method for the automatic assembly of photovoltaic panels with back-contact architecture, based on the use of conducting backsheets constituted substantially by an element for protection against atmospheric agents arranged on the rear side of the panel.

Such backsheets can have variable compositions and patterns depending on the different manufacturers.

BACKGROUND OF THE INVENTION

Currently, most commercially available photovoltaic panels have an absolutely similar architecture as regards the conception of the assembly (basic components) and the assembly process.

This architecture, known as H-type, belongs to the first (current) generation of said panels.

The basic components of H-type panels can be summarized very briefly as follows:

backsheets (hereinafter also referenced as BS=element for protection against atmospheric agents, arranged on the rear side of the panel);

photovoltaic cells (made of single or polycrystalline silicon) with contacts arranged on the front (usually with negative electric polarity) and on the rear (usually with positive electric polarity) of said cells;

strings (which weld in series and in pairs the front to the back of the adjacent photovoltaic cells);

ribbons (which connect in series the above cited strings interposing diodes in the junction box);

two layers of encapsulating material (usually EVA), which enclose at the front and at the rear the cells, the above cited strings and ribbons;

a flat glass, which encloses and protects the front side, exposed to the sun, of the panel;

a frame that encloses the perimeter of the panel;

a junction box arranged on the rear side of the BS to collect the contacts from the rear, connecting to the ribbons.

The standard process for the assembly of H-type panels is usually to a large extent manual and therefore requires considerable labor and can be summarized as in the flowchart shown in FIG. 4.

The main problems that are present in the described background art are:

process for welding the strings of cells: introduces great variabilities in the result in terms of failure, contact resistances, cell degradation, durability over time and under thermal cycling; ultimately, high cell-to-module efficiency loss, typically on the order of 3% to 6% of total conversion efficiency);

complexity of the circuit layout of the series connection between the cells by means of usually rectilinear strings and ribbons;

high thicknesses of the encapsulating materials, which must accommodate the combined thicknesses of photovoltaic cells plus front and rear strings;

non-planar surface on which the photovoltaic cells rest, with great risk and likelihood of failures during the assembly process and during the operation of the panel, which by being heated due to the sun and to the current generated in the metallic conductors (strings) imposes a mechanical stress on said cells; this element constitutes presently a limitation to the thickness of photovoltaic cells, which otherwise could be thinner and therefore less expensive for an equal generated power;

considerable manual work in the assembly process, caused by the difficult and very expensive automation of the process that arises from the architecture of the standard panel; consequent high likelihood of errors, reworking and rejects, with consequent effects on quality, reliability and cost of the finished product;

difficult quality control and inspection of the product during the assembly process; this control is mostly entrusted to the experience of operators and to visual inspections;

high incidence of the cost of labor on the assembly and reworking process.

As an addition or as an improvement to current (first-generation) panels having an H-type architecture described above, second-generation photovoltaic panels, so-called back-contact (BC) panels, are technically feasible.

The basic components of BC architecture panels can be summarized as follows:

back-contact backsheet (hereinafter also referenced as BSBC=element for protection against atmospheric agents arranged on the rear side of the panel, which also provides the electrical connection of the back-contact cells), by means of an adapted electric circuit that is applied for example by lamination or deposition or other methods on the backsheet;

back-contact photovoltaic cells (made of single or polycrystalline silicon) with contacts arranged on the back of the cell with positive and negative electric polarity; exemplifying structures of these back-contact cells are MWT (Metal Wrap Through) cells, EWT (Emitter Wrap Through) cells or IBC (Interdigitated Back Contact) cells;

a conducting material, such as for example ECA (Electronic Conductive Adhesive), or welding pastes or the like, that is applied (by screen printing or dispensing or ink-jetting or other type of deposition), which create an electrical contact between the BCBS and the rear faces of the BC cells at the contacts of different electrical polarity of said cells;

two layers of encapsulating material (usually EVA), of which the rear one is perforated at the contacts that are created by the conducting material, which enclose at the front and at the rear the components;

a flat glass, which encloses and protects the front side, exposed to the sun, of the panel;

a frame that encloses the perimeter of the panel;

a junction box arranged on the rear side of the BCBS to collect the contacts from the rear, connecting to the BCBS.

Despite the unquestionable advantages (economic, qualitative and reliability-related) that a panel with BC architecture has with respect to a traditional H-type panel, the commercial diffusion of BC panels has not occurred yet substantially for two reasons: lack of availability of a BSBC at competitive prices and lack of machinery or of an apparatus that allows to assemble BC panels automatically, conveniently and advantageously in terms of production costs and times.

Patents WO 2011/071373, WO 2012/058053, and the following articles are known:

SPATH M ET AL: "A novel module assembly line using back contact solar cells", CONFERENCE RECORD OF THE IEEE PHOTOVOLTAIC SPECIALISTS CONFERENCE, San Diego, USA, 33TH, 11 May 2008-15 May 2008, pages 1-6, XP002521574, DE JONG P C ET AL: "SINGLE-STEP LAMINATED FULL-SIZE PV MODULES MADE WITH BACK-CONTACTED MC-SI CELLS AND CONDUCTIVE ADHE- SIVES", 19th European Photovoltaic Solar Energy Conference INTERNET CITATION, vol. II 7 Jun. 2004, 11 Jun. 2004, pages 2145-2148, XP002677159, Retrieved from the Internet: URL: ftp://ftp.ecn.nl/pub/www/library/report/2004/rx04067.pdf [retrieved on 2012 Jun. 5], C. TJENGDRAWIRA ET AL: "World first 17% efficient multi-crystalline silicon module", 2010 35TH IEEE PHOTOVOLTAIC SPECIALISTS CONFERENCE, 1 Jun. 2010, pages 002802-002805, XP55012533, DOI: 10.1109/PVSC.2010.5616769 ISBN: 978-1-42-445890-5

JAMES M GEE ET AL: "Development of commercial-scale photovoltaic modules using monolithic module assembly", PHOTOVOLTAIC SPECIALISTS CONFERENCE (PVSC), 2009 34TH IEEE, IEEE, PISCATAWAY, N.J., USA, 7 Jun. 2009,-12 Jun. 2009, pages 2133-2137, XP031626700, ISBN: 978-1-4244-2949-3.

SUMMARY OF THE INVENTION

The aim of the present invention is therefore to solve the described technical problems, eliminating the drawbacks of the cited background art and thus providing an apparatus and a method that allow to provide photovoltaic panels at low costs, with high performance, of excellent quality and durable.

Within this aim, another important object of the invention is to provide an apparatus and a method that allow to achieve high production capacity in a reduced occupation surface, thus reducing costs further.

Another object of the invention is to allow the automatic provision and control of photovoltaic panels, thus allowing a fundamental increase in the repeatability of higher quality standards than what is currently provided.

Another object is to obtain an invention that allows to provide photovoltaic panels and combines with the preceding characteristics that of being subject to optimum and continuous quality control during processing, and which, in case of incorrect operations, prevents the addition of other components and/or operations, thus reducing overall rejects and wastes of time and materials, the value of any rejected material and the cost of any reworking.

This aim and these objects, as well as others that will become better apparent hereinafter, are achieved by an apparatus for the automatic assembly of photovoltaic panels with back-contact architecture, characterized in that it comprises a series of stations that are configured in sequence in a carousel with recirculation of trays and a device, which is adjacent to one or more of said stations for controlling the correctness of the processes performed, said control device enabling the processing or the mere transit of said tray into the subsequent station by comparing the actual state with a predefined state, said apparatus comprising:

a first station for loading a BCBS, with the conducting side facing upwardly, into an empty tray;

a first verification, by means of a first control device, of the position of said BCBS and of the regions onto which a deposition of conducting material is to be performed;

at least one second station for depositing said conducting material in the seats or holes identified in said BCBS;

a second verification, by means of a second control device, of the actual location of the conducting material deposited in said BCBS;

at least one third loading station for the repeatable loading of one or simultaneously plurality of pre-oriented cells on said previously processed BCBS;

a third verification, by means of a third control device, of the position of said cells on said previously processed BCBS;

a fourth station for loading one or more encapsulating layers in contact with the upper side of said previously processed BCBS and with the previously positioned cells;

a fourth verification, by means of a fourth control device, of the presence of said encapsulating layer;

a fifth station for loading a glass on said previously processed BCBS so as to obtain a structure that corresponds to the structure of said panel, said fifth station comprising at least one heating source that is adapted to allow said one or more encapsulating layers to attach to each other by means of the activation of the adhesives and/or of said one or more encapsulating layers themselves without triggering the polymerization thereof;

a sixth station for tipping said tray, which contains said panel, without offset or relative separation of the individual components contained therein and for positioning said glass in a downward position and for subsequently disengaging said tray from said panel 1 and tipping said emptied tray in said first station and unloading said panel to a lamination unit.

Advantageously, the method for the automatic assembly of photovoltaic panels with back-contact architecture is also claimed.

BRIEF DESCRIPTION OF THE FIGURES

Further characteristics and advantages of the invention will become better apparent from the detailed description of a particular but not exclusive embodiment, illustrated by way of nonlimiting example in the accompanying drawings, wherein.

DETAILED DESCRIPTION OF THE INVENTION

Figure 1:
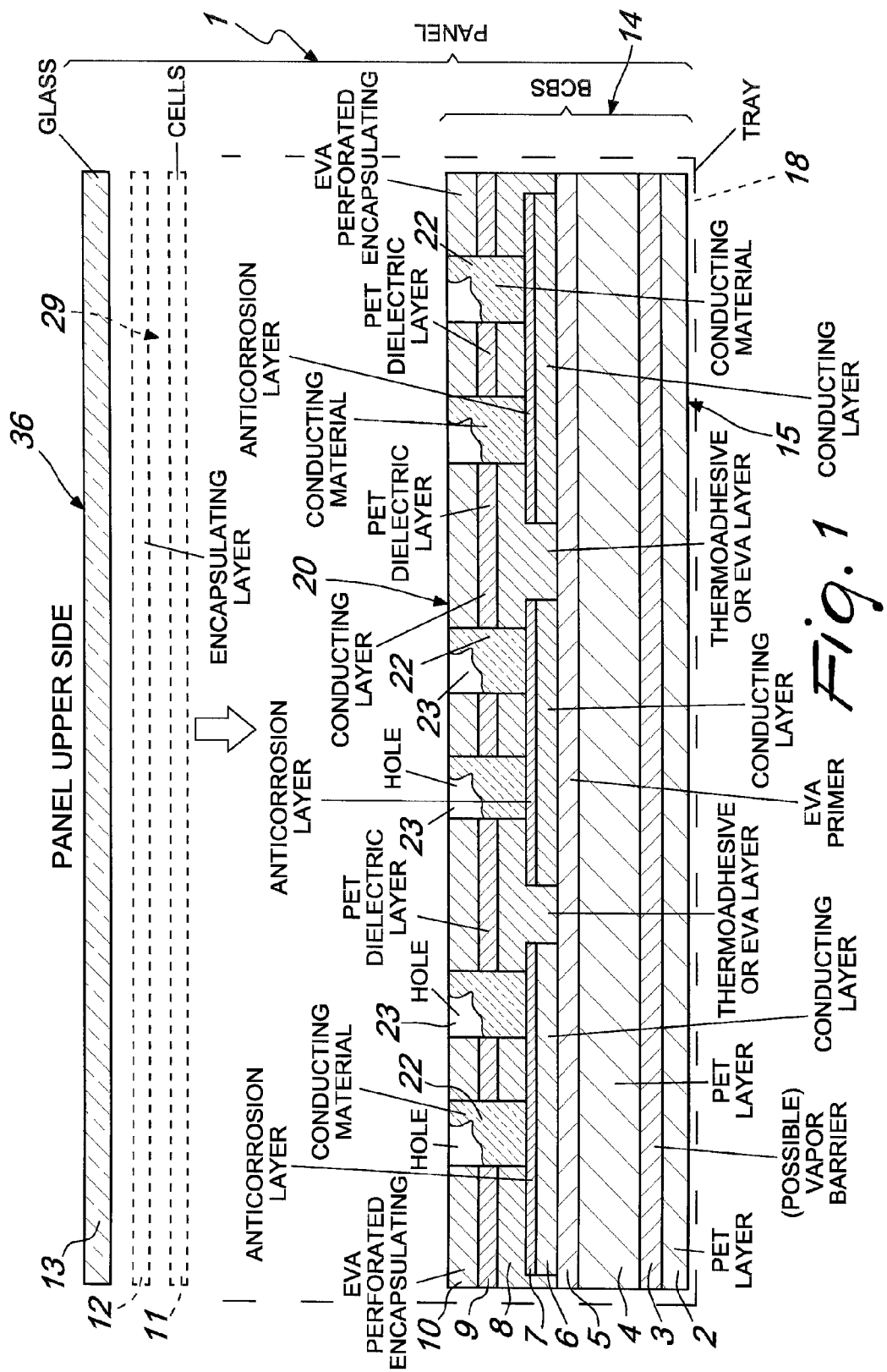
FIG. 1 is a partially sectional schematic view of the final composition of the panel.
Figure 2:
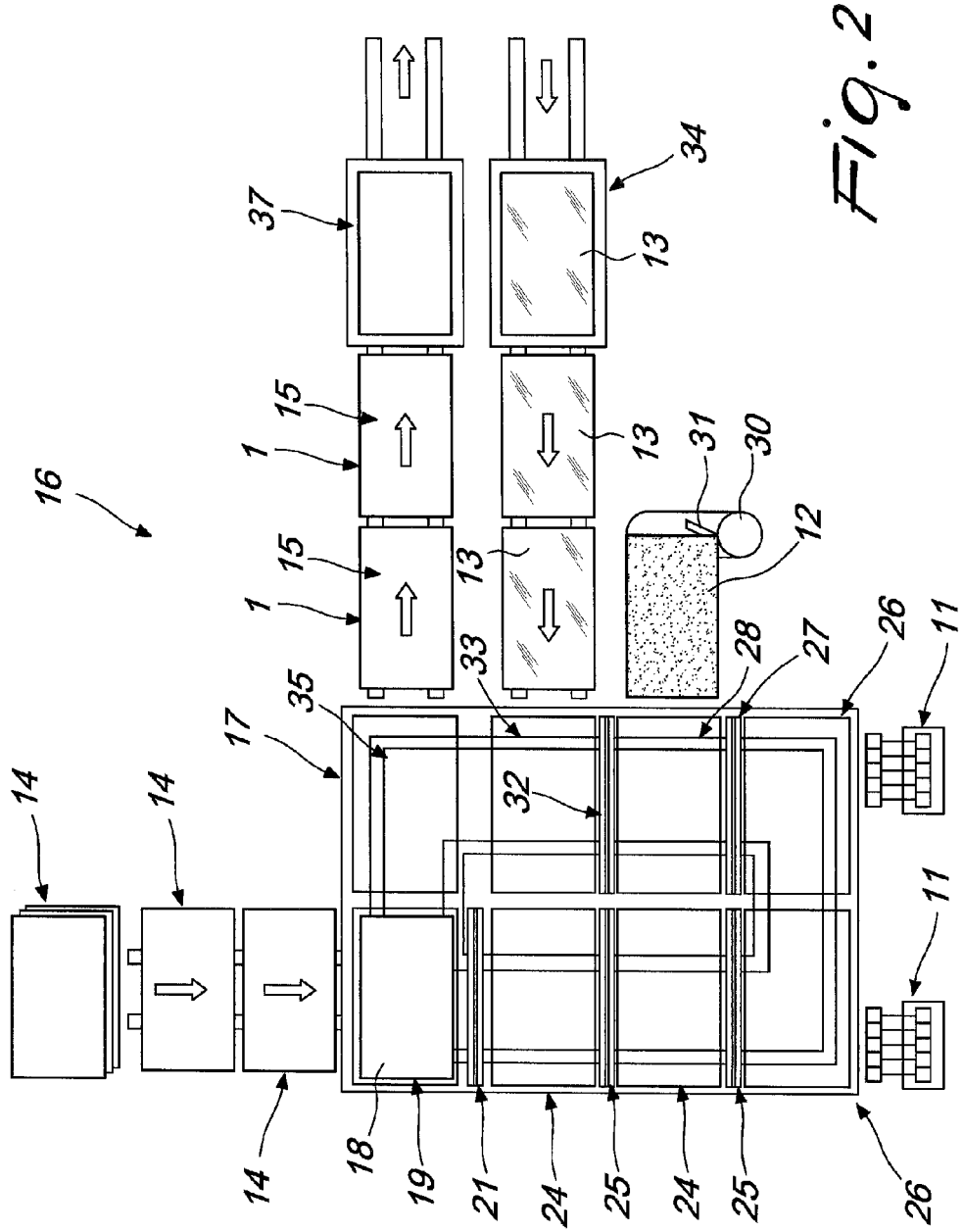
FIG. 2 is a schematic plan view of the apparatus.
Figure 3:
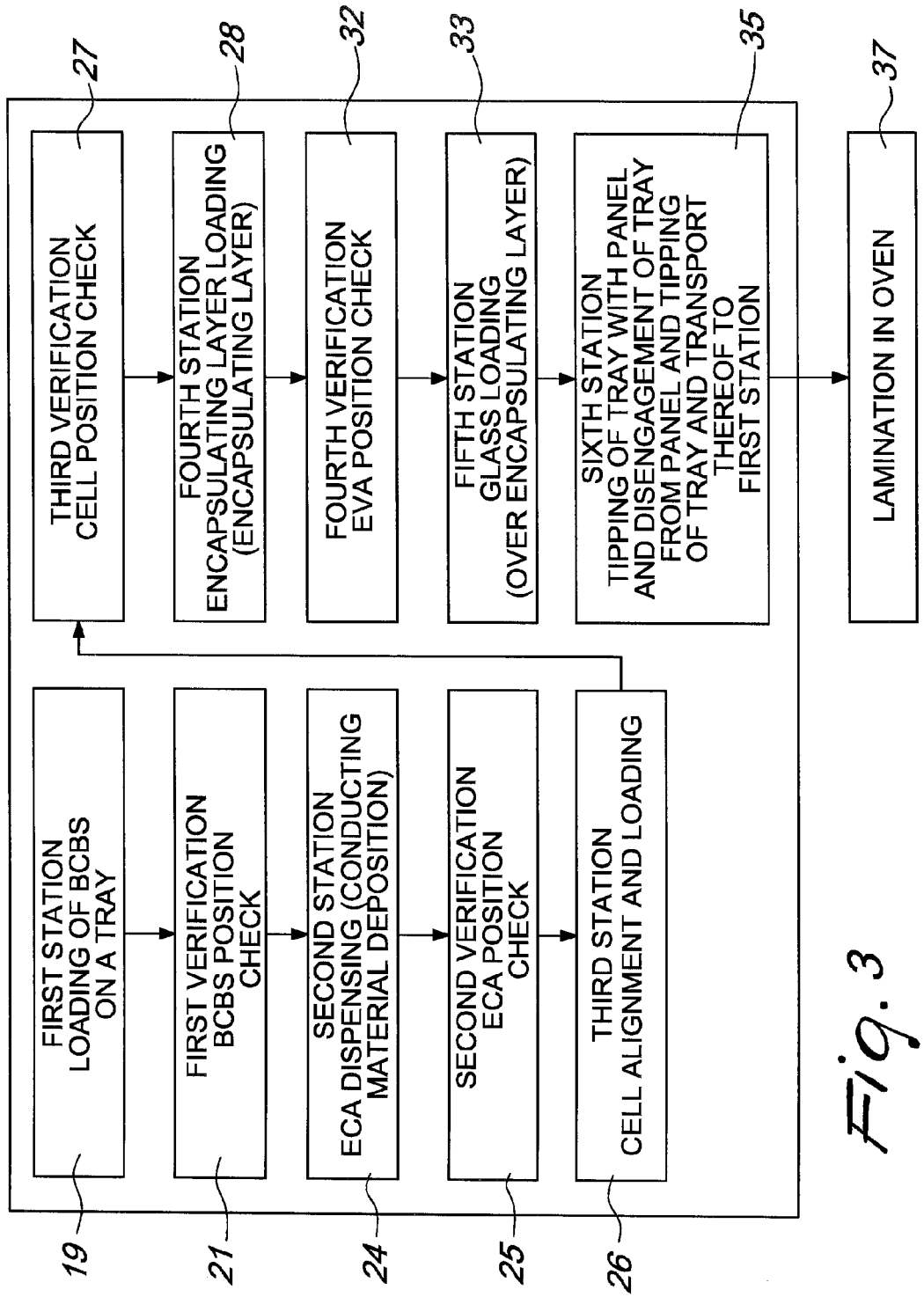
FIG. 3 is a flowchart of the several operations and verifications performed in the apparatus.
Figure 4:
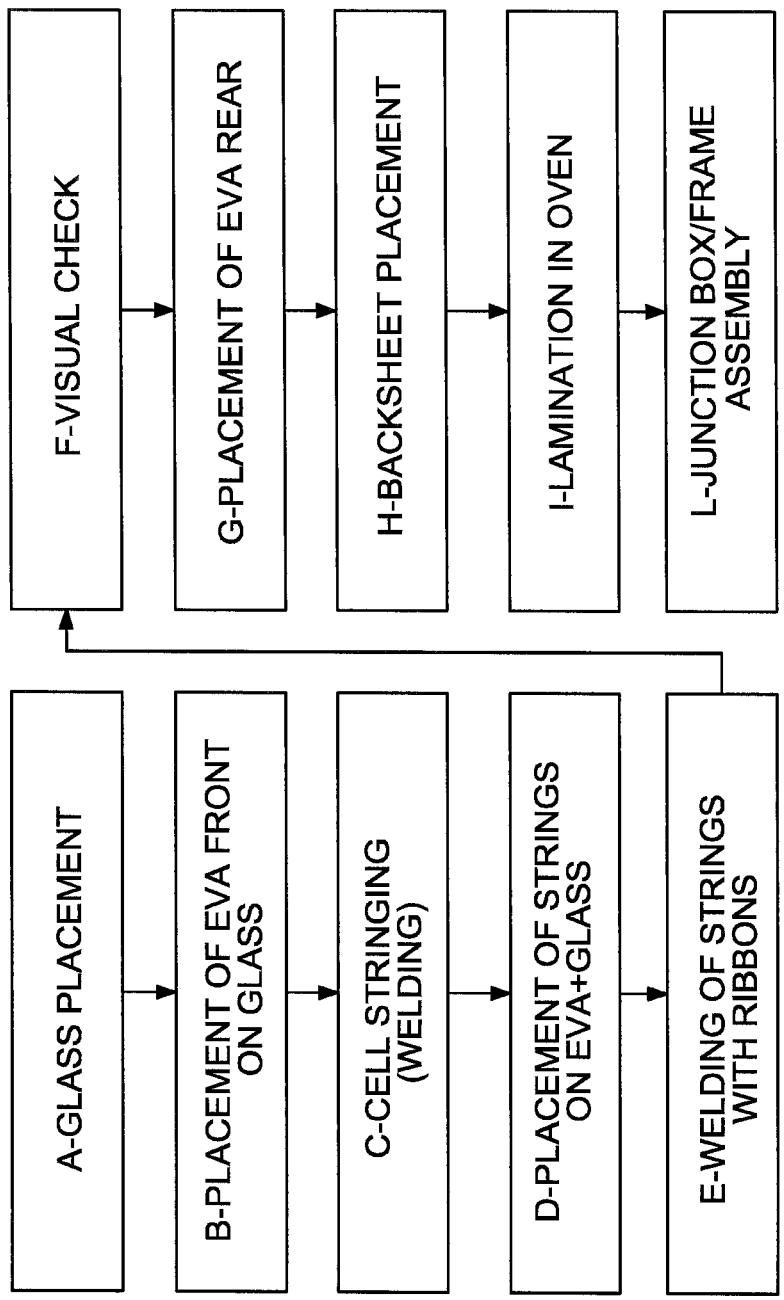
FIG. 4 is a view of the background art.

In the examples of embodiment that follow, individual characteristics, given in relation to specific examples, may actually be interchanged with other different characteristics that exist in other examples of embodiment.

Moreover, it is noted that anything found to be already known during the patenting process is understood not to be claimed and to be the subject of a disclaimer.

With reference to the figures cited above, the reference numeral 1 designates a photovoltaic panel with back-contact architecture, which includes a rear layer 2 made of PET, an optional vapor barrier 3, an additional layer 4 made of PET, a primer layer 5 made of EVA, a conducting layer 6, an anti-corrosion layer 7, a layer 8 that is thermoadhesive or made of EVA, a layer of dielectric 9 for example made of PET, a perforated encapsulating element 10 thermoadhesive or made of EVA.

The photovoltaic panel 1 is also constituted by cells 11, an encapsulating layer 12 and a glass 13.

The numeral 14 designates the BCBS and therefore an element for protection against atmospheric agents arranged on the rear side 15 of the panel 1, which also provides the electrical connection of the back-contact cells.

The numeral 16 designates an apparatus for the automatic assembly of photovoltaic panels 1 with back-contact architecture, which comprises a series of stations 19, 24, 26, 28, 33, 35 that are configured in sequence in a carousel 17 with recirculation of trays 18.

There is then a first station 19 for loading a BCBS 14, with the conducting side 20 directed upwardly, in an empty tray 18; advantageously, the tray 18 is provided with means, for example pneumatic means, adapted to keep in position the BCBS 14 and means adapted to produce a selected and correct placement of the BCBS 14.

A first verification is then performed by means of a first control device 21, such as a linear scanner, arranged adjacent to said first station 19; said first control device 21 verifies the position of the BCBS 14 and of the regions on which a deposition of conducting material 22 is to be performed at adapted holes or seats 23 obtained previously at the BCBS 14.

The first control device, together with also with the subsequent mentioned control devices, has the function of enabling the processing or mere transit of said tray 18 in the subsequent station by comparing the actual state with a predefined state.

The apparatus provides for the presence of at least one second station 24 for the deposition of the conducting material 22 in the seats or holes 23 identified in the BCBS 14.

There is then a second verification, by means of a second control device 25, of the actual location of the conducting material 22 deposited in the BCBS 14.

The apparatus provides for the presence of at least one third station 26 for the repeatable loading of one or simultaneously a plurality of cells 11 that are pre-oriented on the previously processed BCBS 14.

There is then a third verification, performed by means of a third control device 27, of the position of the cells 11 on the previously processed BCBS 14.

The apparatus provides for a fourth station 28 for loading an encapsulating layer 12 in contact with the upper side 29 of said BCBS 14 processed previously and with the previously positioned cells; the encapsulating layer 12 can be taken from an adapted dispenser 30, for example of the roller type, provided with means for cutting to size such as a cutter 31.

There is then a fourth verification, by means of a fourth control device 32, of the presence of said encapsulating layer 12.

The apparatus provides for a fifth station 33 for loading a glass 13 on the previously processed BCBS 14, so as to obtain a structure that corresponds to the structure of the panel 1; the glass 13 can arrive for example from an adapted cleaning device 34.

In the same fifth station, a heating source, such as for example a laser or hot air injected into the tray or a probe with electromagnetic induction, allows the layers of encapsulating materials to attach in several points to each other due to the activation of the adhesives and/or of the encapsulating materials themselves without in any case triggering their polymerization.

The apparatus provides for a sixth station 35 for tipping the tray 18, which contains the panel 1 and is therefore constituted by the BCBS 14, on which therefore the cells 11, the encapsulating layer 12 and the glass 13 have been applied.

Tipping occurs without offset or relative separation of the individual components contained therein (BCBS 14, cells 11, encapsulating layer 12 and glass 13) and is followed by the placement of the glass 13 in a downward position; the upper side 36 of the panel 1 is then positioned downward and no longer upward. In the sixth station 35, the subsequent disengagement of the tray 18 from the panel 1 is also achieved, for example by using a pneumatic technology which no longer retains the panel 1 attached to the bottom of the tray 18. In other words, exit from the tray can be facilitated by the reversal of the flow of air in the tray, which instead of aspirating and creating a partial vacuum can now blow and facilitate expulsion.

The sixth station 35 achieves the subsequent tipping of the tray 18, emptied in the first station 19, and the unloading of the panel 12 to a lamination unit 37.

If one or more of the controls performed in the transfers between the described stations yields a negative outcome regarding the correctness of the operation performed previously, it enables the mere transit of the tray with its content to the subsequent stations until it reaches the first station without undergoing any tipping.

In practice it has been found that the invention has achieved the intended aim and objects, an apparatus and a method having been obtained which allow considerable advantages for the provision of photovoltaic panels in terms of cost, performance, quality and durability and therefore constitutes an important contribution to the advantageous and convenient availability of renewable energy sources.

The equivalent target production capacity for this machine in its basic configuration is approximately 120 MW/year, i.e., approximately 450,000 panels/year.

It is possible to configure the apparatus appropriately so as to increase or decrease the production capacity.

The apparatus is constituted by a carousel which recirculates appropriately devised trays, such as to retain with precision and repeatability the components of the panel being assembled during the several steps of the process.

The described solution is in fact constituted by an automatic process for the assembly of BCBS modules which is simple, reliable and fast; the problems related to relative placement, with a precise and repetitive alignment, of the regions of contact on the rear sides of the cells with respect to the holes of the lower layer of encapsulating material and with respect to the conducting material (of the ECA type or other type) and the conducting paths applied on the BCBS have also been solved.

Consequently, the described solution allows to increase productivity, quality and repeatability of the product, of the control state and ultimately allows greater convenience with respect to usually widespread manual processes.

The described solution also exceeds, in relation to the method, the provisions of WO 2102/050853, since claim 2 specifies the fact that prior to the deposition of conducting material or ECA on the BCBS a step of verifying the position of the BCBS and of the regions on the BCBS onto which the conducting material is to be deposited is performed.

Therefore, the distinctive characteristics of claim 2 with respect to WO 2102/050853 are the use of a supporting tray for the BCBS and the presence of a heating source that is used to ensure that the encapsulation layers attach to each other prior to the final lamination step without triggering their polymerization, and also the fact that there is a step for controlling the position of both the BCBS and the regions of the BCBS onto which the deposition of conducting material or ECA is to be performed.

This allows to perform a deposition of conducting material that is targeted only in the regions (holes) defined on the BCBS, with lower process costs, shorter times and higher repeatability of the process.

WO 2102/050853 neither describes nor suggests control steps or the possibility to perform a targeted deposition of the conducting material.

The materials used, as well as the dimensions that constitute the individual components of the invention, may of course be more pertinent according to the specific requirements.

The several means for performing certain different functions need not certainly coexist only in the illustrated embodiment but can be present per se in many embodiments, including ones that are not illustrated.

The characteristics indicated as advantageous, convenient or the like may also be omitted or be replaced with equivalents.

The disclosures in Italian Patent Application No. TV2012A000211 from which this application claims priority are incorporated herein by reference.

The invention claimed is:

1. An apparatus for the automatic assembly of photovoltaic panels with back-contact architecture, comprising a plurality of stations that are configured in sequence in a carousel with recirculation of trays and a device, which is adjacent to one or more of said stations, for controlling the correctness of the processes performed, said control device enabling the processing or the mere transit of said tray into the subsequent station by comparing an actual state with a predefined state, said apparatus further comprising:
    a first station for loading a BCBS, with the conducting side facing upwardly, into an empty tray;
    a first verification, by means of a first control device, of the position of said BCBS and of the regions onto which a deposition of conducting material is to be performed;
    at least one second station for depositing said conducting material in the seats or holes identified in said BCBS;
    a second verification, by means of a second control device, of the actual location of the conducting material deposited in said BCBS;
    at least one third loading station for the repeatable loading of one or simultaneously a plurality of pre-oriented cells on said previously processed BCBS;
    a third verification, by means of a third control device, of the position of said cells on said previously processed BCBS;
    a fourth station for loading one or more encapsulating layers in contact with the upper side of said previously processed BCBS and with the previously positioned cells;
    a fourth verification, by means of a fourth control device, of the presence of said encapsulating layer;
    a fifth station for loading a glass on said previously processed BCBS so as to obtain a structure that corresponds to the structure of said panel, said fifth station comprising at least one heating source that is adapted to allow said one or more encapsulating layers to attach to each other by means of the activation of the adhesives and/or of said one or more encapsulating layers themselves without triggering the polymerization thereof;
    a sixth station for tipping said tray, which contains said panel, without offset or relative separation of the individual components contained therein and for positioning said glass in a downward position and for subsequently disengaging said tray from said panel and tipping said emptied tray in said first station and unloading said panel to a lamination unit.

2. The apparatus according to claim 1, wherein said BCBS, composed of an element for protection against atmospheric agents that is arranged on a rear side of the panel, which also provides the electrical connection of the back-contact cells and comprises a rear layer made of PET, an optional vapor barrier, an additional layer made of PET, a layer of primer made of EVA, a conducting layer, an anticorrosion layer, a layer that is thermoadhesive or made of EVA, a layer of dielectric made of PET, a perforated encapsulating element made of EVA, is arranged, at a first loading station, with the conducting side directed upwardly in an empty tray, said tray being provided with means adapted to keep in position said BCBS and means adapted to determine a selected and correct placement of said BCBS.

3. The apparatus according to claim 2, wherein said first control device is constituted by a linear scanner that is arranged in a region that is adjacent to said first station, said first control device checking the position of said BCBS and of the regions on which a deposition of conducting material is to be performed at holes or seats obtained previously at said BCBS, said first control device, together also with the subsequent control devices, having the function of enabling the processing or mere transit of said tray in the subsequent station by means of a comparison of the actual state with a predefined state.

4. The apparatus according to claim 1, wherein in said fourth station at least one encapsulating layer is loaded in contact with an upper side of said previously processed BCBS and with said previously positioned cells, said at least one encapsulating layer being picked up from a dispenser provided with means for cutting to size.

5. The apparatus according to claim 1, wherein in said sixth station the tipping of said tray is performed without offsets or relative separations, said panel being constituted by said BCBS on which said cells, said encapsulating layer and said glass have been applied previously.

6. The apparatus according to claim 1, wherein in said sixth station the tipping without offset of the individual components contained therein is performed, followed by the positioning of said glass in a lower position, an upper side of said panel being positioned downward and no longer upward.

7. The apparatus according to claim 1, wherein the subsequent disengagement of said tray from said panel is also achieved in said sixth station by using a pneumatic technology that no longer retains said panel attached to the bottom of said tray.

8. The apparatus according to claim 1, wherein in said station the subsequent tipping of said tray, which is now empty, in said first station, and the unloading of said panel to a lamination unit are also achieved.

9. The apparatus according to claim 1, wherein said control device, if one or more of the controls performed in the passages between said described stations has a negative outcome as regards the correctness of the previously performed operation, enables the mere transit of said tray with its content in the subsequent stations until said first station is reached without undergoing any tipping.

10. A method for the automatic assembly of photovoltaic panels with back-contact architecture, comprising the following steps:
    a) loading a conducting backsheet or BCBS in a self-centering tray arranged on a closed-loop carousel;
    b) controlling the position of said BCBS in said tray;
    b1) controlling the regions of said BCBS on which deposition of conducting material or ECA is to be performed;
    c) applying conducting material or ECA on said BCBS;
    d) controlling the position of said conducting material on said BCBS;
    e) aligning and loading back-contact or MWT or EWT or IBC photovoltaic cells until said BCBS is full;
    f) controlling the position of said back-contact photovoltaic cells;
    g) loading and controlling the position of at least one layer of encapsulating material over said previously processed BCBS and with said previously positioned cells;
    h) preparing a glass and positioning it above said previously processed BCBS so as to obtain structurally said panel;

i) using a heating source that allows the encapsulating layers to attach to each other by means of the activation of the adhesives and/or of the encapsulating elements themselves without triggering their polymerization;
j) tipping said tray containing said panel;
k) unloading said panel from said tray with said glass directed downward;
l) tipping said emptied tray to load a new BCBS;
m) laminating in an oven said panel thus obtained.

* * * * *